United States Patent
Pavlovic

(10) Patent No.: US 7,458,828 B2
(45) Date of Patent: Dec. 2, 2008

(54) ELECTRICAL CONNECTOR AND METHOD OF PRODUCING SAME

(75) Inventor: Slobadan Pavlovic, Canton, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 11/624,409

(22) Filed: Jan. 18, 2007

(65) Prior Publication Data

US 2007/0117453 A1    May 24, 2007

Related U.S. Application Data

(62) Division of application No. 10/907,297, filed on Mar. 28, 2005, now abandoned.

(51) Int. Cl.
*H01R 12/00* (2006.01)

(52) U.S. Cl. .............. 439/83; 439/70; 439/876

(58) Field of Classification Search ............ 439/70, 439/71, 83, 875, 876
See application file for complete search history.

(56) References Cited

U.S. PATENT DOCUMENTS

| | | | |
|---|---|---|---|
| 5,411,236 A | 5/1995 | Morita et al. | |
| 5,535,513 A | 7/1996 | Frantz | |
| 6,056,558 A * | 5/2000 | Lin et al. | 439/83 |
| 6,113,053 A * | 9/2000 | Kumagai et al. | 248/499 |
| 6,152,742 A * | 11/2000 | Cohen et al. | 439/60 |
| 6,422,878 B1 | 7/2002 | Pape et al. | |
| 6,501,665 B1 * | 12/2002 | Ted | 361/808 |
| 6,644,985 B2 | 11/2003 | Wilson et al. | |
| 6,692,265 B2 | 2/2004 | Kung et al. | |
| 6,840,810 B2 * | 1/2005 | Brunker et al. | 439/637 |
| 6,979,238 B1 | 12/2005 | Mongold et al. | |
| 2002/0177334 A1 * | 11/2002 | Akama et al. | 439/74 |
| 2005/0020108 A1 | 1/2005 | Ju | |
| 2005/0064745 A1 | 3/2005 | Zhang | |
| 2006/0216970 A1 | 9/2006 | Pavlovic | |

FOREIGN PATENT DOCUMENTS

EP    1 065 754 A1    1/2001

* cited by examiner

*Primary Examiner*—James Harvey
(74) *Attorney, Agent, or Firm*—Brooks Kushman P.C.

(57) ABSTRACT

A surface mount electrical connector includes a terminal body having a first elongate member that cooperates with a housing to secure the terminal body to the connector housing. A second elongate member of the terminal body includes a curved portion having an aperture therethrough. The curved portion includes a convex surface that facilitates automated assembly operations, and the aperture helps to overcome surface tension in liquid solder, thereby promoting a secure electrical connection.

12 Claims, 2 Drawing Sheets

ELECTRICAL CONNECTOR AND METHOD OF PRODUCING SAME

CROSS-REFERENCE TO RELATED APPLICATION

This application is a division of U.S. application Ser. No. 10/907,297, filed 28 Mar. 2005 and entitled "Electrical Connector Terminal And Method Of Producing Same."

BACKGROUND OF THE INVENTION

1. Field of the Invention

The present invention relates to an electrical connector, and a method of producing such a connector.

2. Background Art

As the use of electronic devices becomes increasingly prevalent, there is a need to provide an ever increasing number of electronic components on printed circuit boards (PC boards). In the past, it was not uncommon for an electronic component to have wire leads that were inserted into holes in the PC board. With this "through-hole" technology, the wire leads from the electronic component extended completely through the PC board. This made it difficult, if not impossible, to use both sides of the PC board for different circuits.

In many cases today, through-hole connections on PC boards have been replaced with surface mount technology (SMT). With SMT components, blade terminals have replaced the wire leads which formerly extended through the PC boards. These terminals are connected to a surface of one side of the PC board, usually by soldering. This leaves the opposite side of the PC board available for constructing a different circuit using the same or different SMT components.

Because electronic components are often very light weight, it is not uncommon for the surface tension present in the liquid solder to push the SMT component up and away from the PC board; this is sometimes called the "Manhattan effect". When this happens, the resulting connection between the SMT component and the PC board can be weak. Even if some of the solder does adhere to a terminal on the SMT connector, the solder may pull back from the terminal when it cools. Moreover, even if some of the solder remains in contact with a terminal, the connection can be broken during use, particularly if the PC board is located in an area subject to vibration—e.g., in an electrical box in a vehicle.

Therefore, it would be desirable to provide an SMT connector that overcame some or all of the surface tension of the liquid solder when it was being connected to a PC board.

SUMMARY OF THE INVENTION

The present invention provides an SMT connector having a terminal with a geometric configuration that helps to ensure a strong connection to a PC board despite surface tension in a liquid solder used to connect it.

The invention also provides a surface mount electrical connector that includes a blade terminal having a terminal body including a first portion configured to cooperate with a housing of the electrical connector for securing the terminal body to the connector housing. The terminal body further includes a second portion in electrical communication with the first portion. The second portion includes an aperture therethrough configured to receive an electrically conductive material therein. This facilitates an electrical connection between the second portion and a surface of an electrical board.

The invention further provides a header connector for an electrical box in a vehicle. The electrical box includes an electrical board. The connector includes a connector housing configured to receive an in-line connector attached to a wiring harness for electrically connecting the electrical box to the wiring harness. The connector also includes a blade terminal including first and second elongate members in electrical communication with each other. The first elongate member is configured to cooperate with the connector housing for securing the first elongate member to the connector housing. The second elongate member includes an aperture therethrough for receiving at least partially melted solder therein. This facilitates an electrical connection between the second elongate member and a surface of the electrical board.

The invention also provides a method for producing a header connector that includes a blade terminal and a housing. The method includes forming a first elongate member of the blade terminal capable of cooperating with the housing for securing the first elongate member to the housing. A second elongate member of the blade terminal is formed, and is configured for electrical connection to the first elongate member. An aperture is formed through the second elongate member for receiving an electrically conductive material therein. This facilitates an electrical connection between the second elongate member and a surface of an electrical board. The first elongate member is connected to the housing.

DETAILED DESCRIPTION OF THE PREFERRED EMBODIMENT(S)

Figure 1:
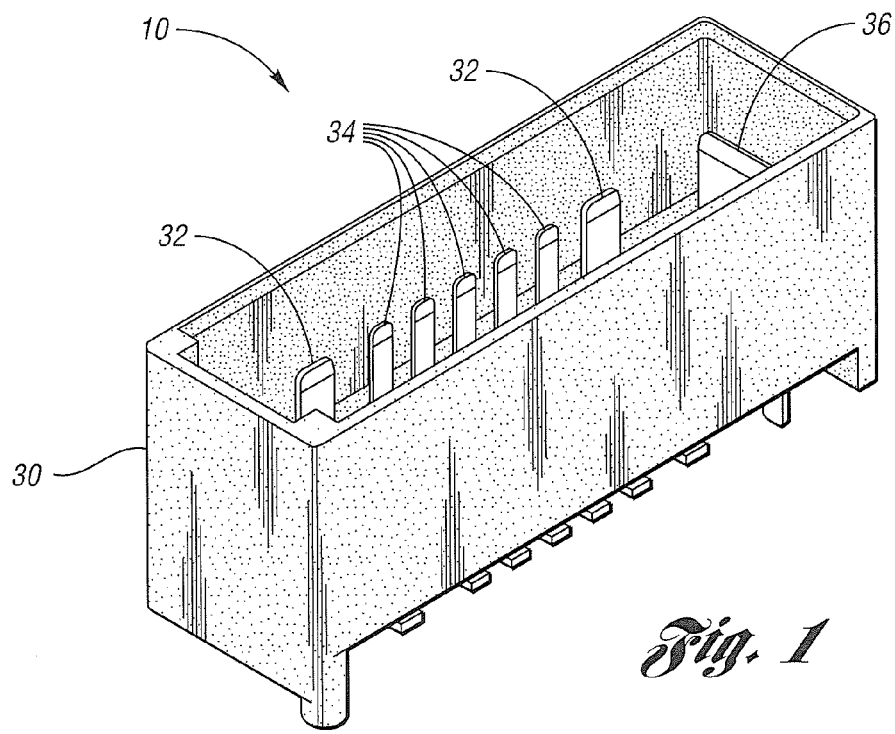
FIG. 1 is a perspective view of an electrical connector including blade terminals in accordance with the present invention.
Figure 2A:
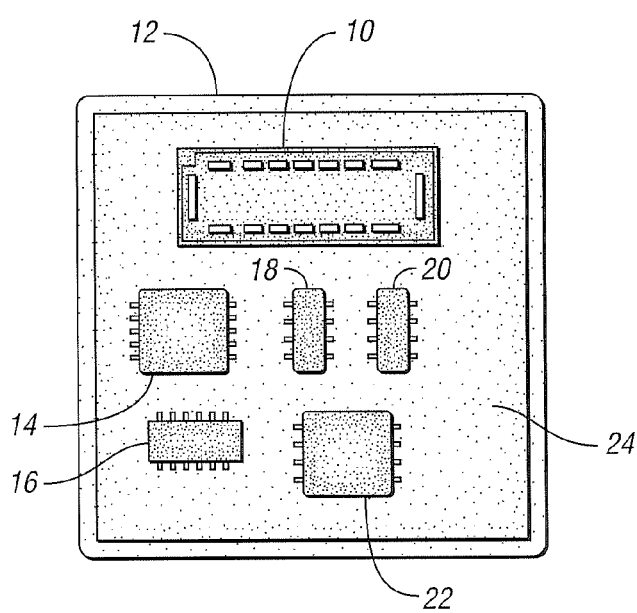
FIG. 2A is a front plan view of a power distribution box for a vehicle that includes the electrical connector shown in FIG. 1.
Figure 2B:
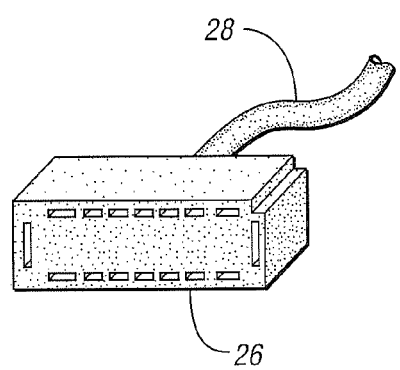
FIG. 2B is a perspective view of an in-line connector configured to mate with the connector shown in FIG. 2A.

FIG. 1 shows an SMT connector 10 in accordance with one embodiment of the present invention. In particular, the connector 10 shown in FIG. 1 is a header connector that can used in an electrical box 12 —see FIG. 2A —such as might be used in a vehicle. The electrical box 12 could, for example, be a power distribution box, or a junction box. As shown in FIG. 2A, the electrical box 12 includes a number of electronic components 14, 16, 18, 20, 22 which are attached to a PC board 24. If, for example, the electrical box 12 is a power distribution box in a vehicle, an in-line connector 26 —see FIG. 2B —can be used to connect the header connector 10 to various systems within the vehicle via a wiring harness 28.

Figure 3:
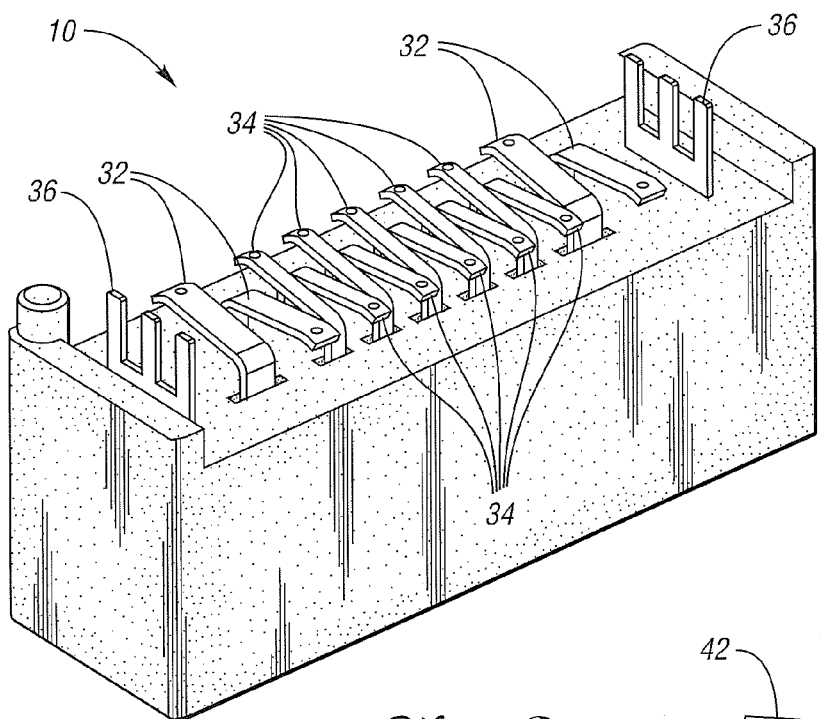
FIG. 3 is a perspective view of the underside of the connector shown in FIG. 1.

Returning to FIG. 1, it is shown that the header connector 10 includes a connector housing 30 and a number of electrical terminals 32, 34, 36. FIG. 3 shows the underside of the connector 10 including portions of the various electrical terminals that will connect to a PC board, such as the PC board 24 shown in FIG. 2A. As shown in FIG. 3, each of the terminals 32 (two on each side of the connector 10) and the terminals 34 (five on each side of the connector 10) are blade terminals configured to facilitate surface mounting of the connector 10 to a PC board, such as the PC board 24. Conversely, the terminals 36 (two on each end of the connector 10) are through-hole terminals which are configured to be located within holes in a PC board, such as the PC board 24. A connector, such as the connector 10, may or may not include through-hole terminals, such as the terminals 36. The through-hole terminals can be beneficial, however, in that they can be used to help position a connector on a PC board. Moreover, if only a small number of through-hole terminals are used, this still leaves most of the opposite side of a PC board available for use in the creation of another circuit.

Figure 4:
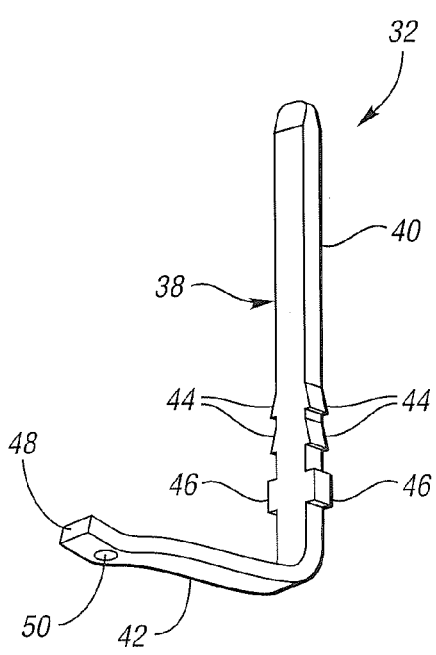
FIG. 4 is a perspective view of a blade terminal used in the connector shown in FIG. 1.

As shown in FIG. 3, the blade terminals 32, 34 each have a hole located near one end; this is illustrated in more detail in FIG. 4. FIG. 4 shows one of the blade terminals 32 that can be used with a connector, such as the connector 10. The blade terminal 32 includes a terminal body 38 which has a first portion, or first elongate member 40, and a second portion, or second elongate member 42. As shown in FIG. 4, the first and second elongate members 40, 42 form a unitary structure. In fact, the first and second elongate members 40, 42 can be formed in a single stamping operation from a single piece of electrically conductive material, such as a copper alloy.

The first elongate member 40 includes barbs 44 that are configured to cooperate with the connector housing 30 to secure the terminal body 38 to the connector housing 30. It may be convenient to manufacture the connector housing 30 from any of the number of engineering polymers which are not electrically conductive, but are strong enough to securely hold a number of terminals, such as the blade terminal 32. The blade terminals 32, 34 can be "stitched in" to the connector housing 30 in an automated manufacturing operation that is familiar to those in the art. In addition to the barbs 44 which help to secure the terminal 32 to the connector housing 30, the first elongate member 40 also includes stops 46 which help to locate the terminal 32 to the proper depth in the connector housing 30.

In the embodiment shown in FIG. 4, the second elongate member 42 includes a distal end 48 that is disposed away from the first elongate member 40. Proximate the distal end 48 is an aperture 50 which goes through the second elongate portion 42. Of course, an aperture, such as the aperture 50, need not be proximate a distal end, and could be located close to the first elongate member 40. As discussed more fully below, the aperture 50 helps to overcome some of the problems associated with mounting SMT connectors and components to PC boards.

As noted above, SMT connectors and components are often mounted to PC boards using an electrically conductive material, such as solder. The surface tension that exists in liquid solder often inhibits a good connection between the solder and the terminal; this, in turn, inhibits a good electrical connection between the terminal and the PC board. The aperture 50 in the terminal 32 helps to overcome the surface tension in a material such as solder, by drawing the liquid solder up through the aperture 50 and onto an upper surface of the terminal. Although solder is used as an example, the present invention may also be effective to overcome surface tension in other electrically conductive materials.

Figure 5A:
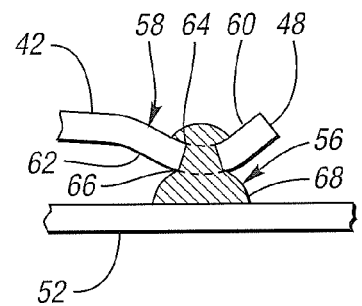
FIG. 5A is a detail view of a portion of the connection between the terminal and PC board shown in FIG. 5.
Figure 5:
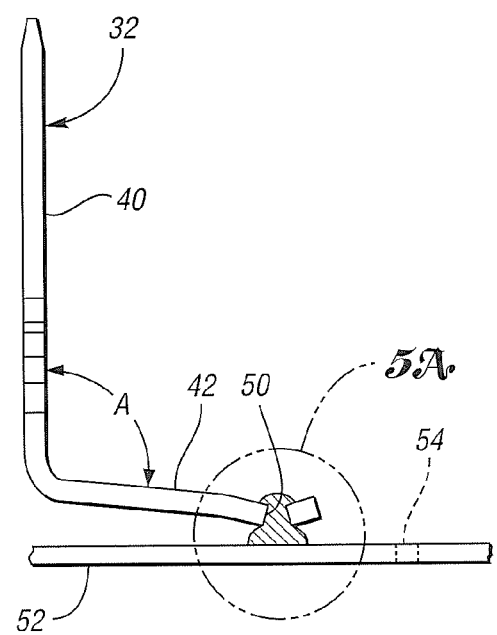
FIG. 5 is a side plan view of the blade terminal shown in FIG. 4, connected to a portion of a PC board.

This phenomenon is illustrated in FIG. 5. In FIG. 5, the terminal 32 is shown attached to a portion of a PC board 52. The PC board 52 includes an aperture 54 which can be used, for example, to accommodate a through-hole terminal, such as the terminals 36 shown in FIG. 3. The connection between the terminal 32 and the PC board 52 is shown in detail in FIG. 5A. As shown in FIG. 5A, a small amount of solder 56 is used to connect the terminal 32 to the PC board 52. Also shown in FIG. 5A, is that near the proximate end 42 of the second elongate member 42 there is a curved portion 58. The curved portion 58 includes a concave surface 60 and a convex surface 62. The solder 56 resides on both the concave surface 60 and the convex surface 62 because it has been drawn up through the aperture 50. Depending on the configuration of the aperture 50, which need not be perfectly round, a capillary action may occur, whereby the surface tension in the solder is overcome and the solder is drawn up through the aperture 50 to the concave surface 60.

As noted above, the aperture 50 need not be perfectly round. Moreover, as shown in FIG. 5A, a transverse cross section of the aperture 50 may be tapered such that the aperture 50 has a first diameter 64 at the concave surface 60, and a second diameter 66 at the convex surface 62 that is larger than the first diameter 64. The shape of the transverse cross section of the aperture 50 will largely depend on how the curved portion 58 of the second elongate member 42 is formed. For example, if the aperture 50 is formed before the curved portion 58 is formed, the forming of the curved portion 58 may distort the otherwise rectangular cross section of the aperture 50.

The aperture 50 and the curved portion 58 both help to facilitate a stronger connection between the terminal 32 and the PC board 52. As noted above, the aperture 50 helps to overcome surface tension in the solder by drawing it up through the aperture so that the solder makes contact with both an upper and lower surface of the terminal 32. The curved portion 58 not only helps to contain the solder 56 in the concave portion 60, but also helps to locate the terminal 32 on the PC board 52. Processes for placement of electrical components and connectors, such as the connector 10, tend to be highly automated. Thus, it is valuable to have reference points that are readily discernable through machine vision and other automated techniques. Because the aperture 50 is located through the curved portion 58 of the second elongate member 42, placement of the convex surface 62 over the solder 56 helps to ensure that the aperture 50 will receive the solder as it melts. Discerning a curved portion, such as the curved portion 58, may be much easier for automated equipment than if the second elongate member 42 was completely flat. In addition to the side-to-side curvature shown in FIG. 5A, the curved portion 58 may also be curved across a width of the second elongate member 42, thereby creating a generally spherical curved surface which can be easily aligned with a convex and generally spherical surface 68 of the solder 56.

As shown in FIG. 5, the first and second elongate members 40, 42 may be formed such that an obtuse angle (A) exists between them. This facilitates enhanced contact between the convex surface 62 and the solder 56 by introducing strain into the terminal 32 as the connector 10 is pressed onto the PC board 52. As noted above, the first and second elongate members 40, 42 can be stamped from a single piece of electrically conductive material in a single operation. It may be necessary, however, to use a secondary operation to form the angle (A) between the first and second elongate member 40, 42. Depending on how the stamping operation is set up, the aperture 50 can also be formed substantially simultaneously with the first and second elongate members 40, 42 in the single operation stamping process. The material used to make the terminal 32 may be coated with another material, as desired. For example, if the terminal 32 is made from a copper alloy, it may be desirable to coat it with a material such as tin, or a tin alloy. This can help inhibit surface oxidation which might otherwise occur on the terminal 32. It is worth noting that a coating, such as a tin coating, can be applied before or after the aperture 50 is formed. This is because tin has a relatively low melting point, and if it fills the aperture 50, it will melt away when exposed to the hot solder. Thus, the present invention also provides flexibility with regard to manufacturing processes.

As discussed above, the shape of the aperture 50 may be altered if the curved portion 58 is formed after the aperture 50 is formed. Despite the alteration of the shape of the aperture 50, the sequence of this process may be desirable, since the forming of the curved portion 58 can cause a material, such as a copper alloy, to be strain hardened. This would make it more difficult to form the aperture 50, and require more energy in the manufacturing process. It is worth noting that some blade terminals may be too small to effectively stamp an aperture, such as the aperture 50. In such a case, a laser or other method could be used to form the aperture. Once they are formed, the terminals 32 can be stitched-in, or otherwise secured to the connector housing 30.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A header connector for an electrical box in a vehicle, the electrical box including an electrical board, the connector comprising:
   a connector housing configured to electrically connect with an in-line connector attached to a wiring harness for electrically connecting the electrical box to the wiring harness; and
   a blade terminal including first and second elongate members in electrical communication with each other, the first elongate member being configured for attachment to the connector housing, the second elongate member having a distal end disposed away from the first elongate member, the second elongate member including a curved portion near the distal end and having an aperture therethrough for receiving at least partially melted solder therein, thereby facilitating an electrical connection between the second elongate member and a surface of the electrical board.

2. The header connector of claim 1, wherein the first and second elongate members form a unitary structure.

3. The header connector of claim 1, wherein the curved portion includes a convex surface for contacting a convex surface of the solder when the solder is disposed on the surface of the electrical board.

4. The header connector of claim 3, wherein the curved portion includes a concave surface opposite the convex surface, and wherein the aperture in the second elongate member is tapered, having a first diameter at the concave surface and a second diameter at the convex surface different from the first diameter.

5. The header connector of claim 4, wherein the first elongate member forms an obtuse angle with the second elongate member, thereby facilitating enhanced contact between the convex surface of the second elongate member and the solder on the surface of the electrical board when the first portion is secured to the connector housing and oriented substantially perpendicular to the surface of the electrical board.

6. The header connector of claim 5, further comprising a plurality of the blade terminals attached the connector housing.

7. The header connector of claim 6, further comprising an electrical terminal configured for insertion into an aperture in the electrical board.

8. The header connector of claim 3, wherein the convex surface of the curved portion of the second elongate member is generally spherical.

9. The header connector of claim 8, wherein the first elongate member includes at least one barb configured to cooperate with the connector housing to facilitate the attachment of the first elongate member to the connector housing.

10. The header connector of claim 9, wherein the first elongate member further includes at least one stop for locating the blade terminal to a desired depth in the connector housing.

11. The header connector of claim 1, wherein the first elongate member includes at least one barb configured to cooperate with the connector housing to facilitate the attachment of the first elongate member to the connector housing.

12. The header connector of claim 1, wherein the first elongate member further includes at least one stop for locating the blade terminal to a desired depth in the connector housing.

* * * * *